(12) United States Patent
Nakamura (10) Patent No.: US 11,231,756 B2
(45) Date of Patent: Jan. 25, 2022

(54) SERVER RACK COOLING DEVICE (71) Applicant: NEC Platforms, Ltd., Kawasaki (JP)

(72) Inventor: Yasuhito Nakamura, Kanagawa (JP)

(73) Assignee: NEC Platforms, Ltd., Kanagawa (JP)

( * ) Notice: Subject to any disclaimer, the term of this patent is extended or adjusted under 35 U.S.C. 154(b) by 0 days.

(21) Appl. No.: 16/756,047

(22) PCT Filed: Jul. 30, 2018

(86) PCT No.: PCT/JP2018/028410
§ 371 (c)(1),
(2) Date: Apr. 14, 2020

(87) PCT Pub. No.: WO2019/077838
PCT Pub. Date: Apr. 25, 2019

(65) Prior Publication Data
US 2020/0249732 A1 Aug. 6, 2020

(30) Foreign Application Priority Data

Oct. 18, 2017 (JP) .............................. JP2017-201777

(51) Int. Cl.
*G06F 1/20* (2006.01)
*H01L 23/473* (2006.01)
(Continued)

(52) U.S. Cl.
CPC .............. *G06F 1/20* (2013.01); *H01L 23/473* (2013.01); *H05K 7/18* (2013.01); *H05K 7/20218* (2013.01);
(Continued)

(58) Field of Classification Search
CPC .............. H01L 23/473; H05K 7/20772; H05K 7/20781; H05K 7/2079; H05K 7/20254;
(Continued)

(56) References Cited

U.S. PATENT DOCUMENTS 9,913,402 B2 * 3/2018 Shafer ................ H05K 7/20272
2003/0051860 A1 * 3/2003 Montgomery ..... H05K 7/20009
165/46
(Continued)

FOREIGN PATENT DOCUMENTS

JP 2007-066480 A 3/2007
JP 2009-147156 A 7/2009
(Continued)

OTHER PUBLICATIONS

International Search Report for PCT/JP2018/028410, dated Sep. 18, 2018.
(Continued)

*Primary Examiner* — Adam B Dravininkas
(74) *Attorney, Agent, or Firm* — Sughrue Mion, PLLC (57) ABSTRACT

A serving rack cooling device. The device includes a rack; an enclosure provided inside the rack; a module provided inside the enclosure; a main pipe provided in the rack; a branching tube connected to the main pipe; a cooling unit that cools a heat-generating component mounted on the module; a first connection tube that connects the branching tube with the cooling unit; and a plurality of module connection portions that are provided inside the enclosure and to which the module is connected. The enclosure can slide in a state in which the module is connected to the module connection portion, and the cooling unit and the branching tube are connected by the first connection tube.

11 Claims, 8 Drawing Sheets

(51) Int. Cl.
*H05K 7/18* (2006.01)
*H05K 7/20* (2006.01)

(52) U.S. Cl.
CPC ... *H05K 7/20709* (2013.01); *G06F 2200/201* (2013.01)

(58) Field of Classification Search
CPC .......... H05K 7/20809; H05K 7/20763; H05K 7/20218; H05K 7/20281; H05K 7/18; H05K 7/20709; H05K 7/20645; H05K 7/20636; H05K 7/20272; G06F 1/20; G06F 2200/201
See application file for complete search history.

(56) References Cited

U.S. PATENT DOCUMENTS

| | | | | |
|---|---|---|---|---|
| 2003/0128516 A1* | 7/2003 | Faneuf | ............... | H05K 7/20809 361/704 |
| 2004/0221604 A1* | 11/2004 | Ota | ................... | H05K 7/20781 62/259.2 |
| 2007/0002536 A1 | 1/2007 | Hall et al. | | |
| 2011/0026225 A1* | 2/2011 | Ostwald | ............ | H05K 7/20781 361/699 |
| 2011/0069454 A1* | 3/2011 | Campbell | ............ | H05K 7/2079 361/700 |
| 2011/0240281 A1* | 10/2011 | Avery | ................ | H05K 7/20836 165/287 |
| 2011/0315353 A1* | 12/2011 | Campbell | .......... | H05K 7/20809 165/104.31 |
| 2013/0120926 A1* | 5/2013 | Barina | ................ | F28D 15/0275 361/679.32 |
| 2013/0135812 A1* | 5/2013 | Barina | .................. | H01L 23/473 361/679.32 |
| 2014/0085821 A1* | 3/2014 | Regimbal | .......... | H05K 7/20236 361/699 |
| 2018/0135901 A1* | 5/2018 | Hirai | ................. | H05K 7/20781 |

FOREIGN PATENT DOCUMENTS

| | | |
|---|---|---|
| JP | 2011-518395 A | 6/2011 |
| JP | 2013-065227 A | 4/2013 |
| JP | 2013-257005 A | 12/2013 |
| WO | 2009/131810 A2 | 10/2009 |
| WO | 2016/076882 A1 | 5/2016 |

OTHER PUBLICATIONS

Extended European Search Report for EP Application No. EP18867643.1 dated Jun. 16, 2021.
Japanese Office Action for JP Application No. 2017-201777 dated Sep. 14, 2021 with English Translation.

* cited by examiner

SERVER RACK COOLING DEVICE

CROSS REFERENCE TO RELATED APPLICATIONS

This application is a National Stage of International Application No. PCT/JP2018/028410 filed Jul. 30, 2018, claiming priority based on Japanese Patent Application No. 2017-201777 filed Oct. 18, 2017, the entire disclosure of which is incorporated herein by reference.

TECHNICAL FIELD

The present invention relates to a device.

BACKGROUND ART

Patent Document 1 discloses a rack system for storing a plurality of cases in a rack. In this rack system, a plurality of electronic components are provided inside each case. Each case is provided with a plurality of pipes that feed a coolant, in a concentrated manner, to heat-generating components among the plurality of electronic components. Additionally, the rack is provided with a flow inlet manifold and a discharge outlet manifold to which the pipes of a plurality of cases are connected. The flow inlet manifold and the discharge outlet manifold are connected to a cooling return passage or a cooling discharge line.

CITATION LIST

Patent Literature

[Patent Document 1]
Japanese Unexamined Patent Application, First Publication No 2011-518395

SUMMARY OF INVENTION

Problem to be Solved by the Invention

In some cases, a module inside a case (enclosure) is made detachable for the purpose of maintenance. The structure in Patent Document 1 is a structure for cooling multiple electronic components at once, so labor is involved in attaching and detaching the electronic components inside the case and the pipes connected to the electronic components. Therefore, it is difficult to replace electronic components (modules) or to perform maintenance and inspections inside a server.

The present invention provides a device in which work such as the replacement of a module inside an enclosure can be easily performed.

Means for Solving the Problem

The device according to the present invention includes a rack; an enclosure provided inside the rack; a module provided inside the enclosure; a main pipe provided in the rack; a branching tube connected to the main pipe; a cooling unit that cools a heat-generating component mounted on the module; a first connection tube that connects the branching tube with the cooling unit; and a plurality of module connection portions that are provided inside the enclosure and to which the module is connected; wherein the enclosure can slide in a state in which the module is connected to the module connection portion, and the cooling unit and the branching tube are connected by the first connection tube.

Advantageous Effects of Invention

According to the device in the present invention, it is possible to easily perform work such as the replacement of a module inside an enclosure.

DESCRIPTION OF EMBODIMENTS

Multiple embodiments of the present invention will be explained below with reference to the drawings. However, regarding the present embodiments, the portions that are identical to the aforementioned conventional examples will be referred to by using the same names, and their explanations will be omitted.

Figure 1:
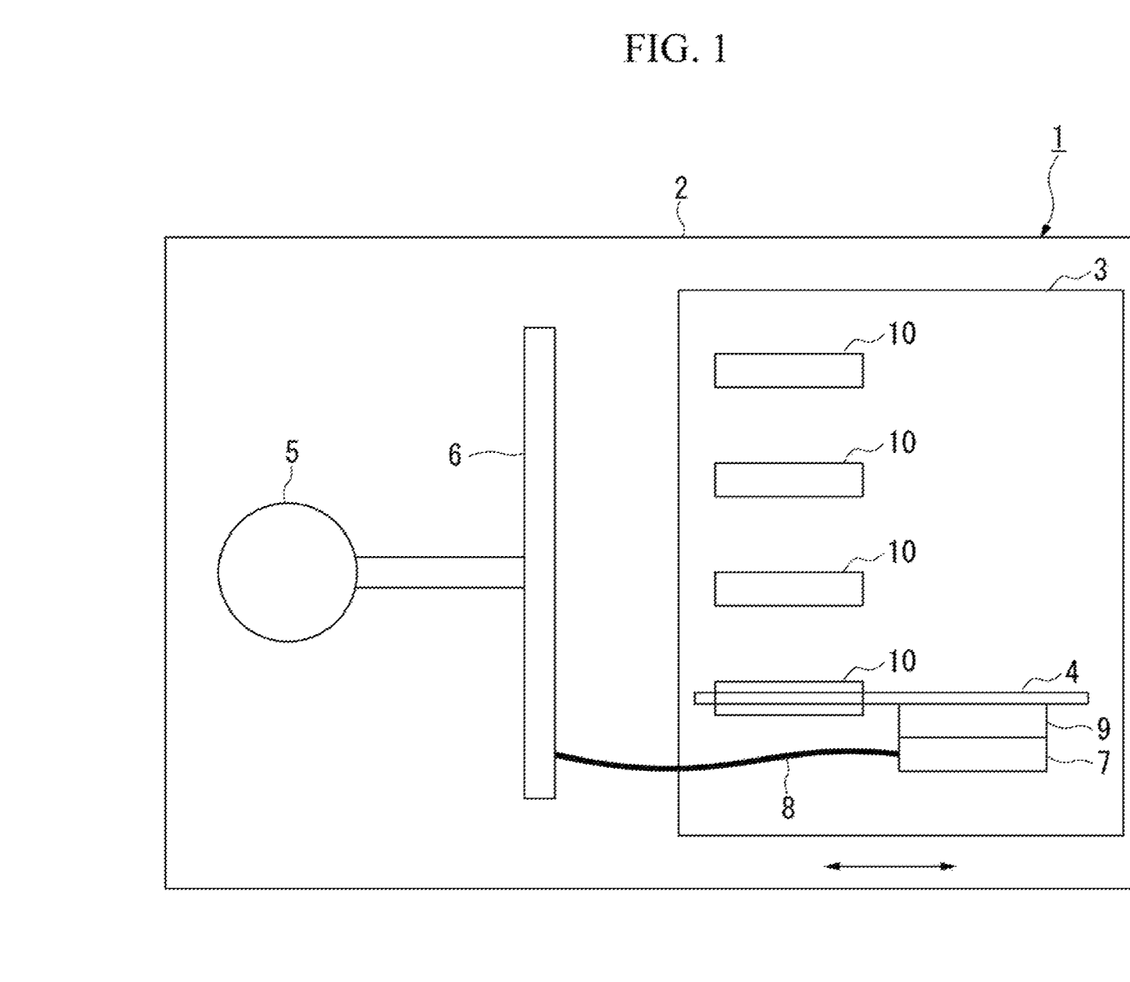
FIG. 1 is a diagram illustrating the minimum structure of a device according to a first embodiment.

[First Embodiment]
FIG. 1 is a diagram illustrating the minimum structure of a device according to a first embodiment.
As illustrated in this drawing, it is sufficient for the device 1 to comprise at least a rack 2, an enclosure 3, a module 4, a main pipe 5, a branching tube 6, a cooling unit 7, a connection tube 8 and module connection portions 10.
The enclosure 3 is provided inside the rack 2. Inside the enclosure 3 are provided a plurality of module connection portions 10 to which the module 4 is connected.
The module 4 is provided inside the enclosure 3. A heat-generating component 9 is mounted on the module 4.
The main pipe 5 is provided in the rack 2. The branching tube 6 is connected to the main pipe 5.
The cooling unit 7 cools the heat-generating component 9 mounted on the module 4. The connection tube 8 connects the branching tube 6 with the cooling unit 7. In this device 1, the enclosure 3 is able to slide, for example, in the direction of the arrow in the drawing, in a state in which the module 4 is connected to a module connection portion 10 and the cooling unit 7 is connected to the branching tube 6 by the connection tube 8.
In this device 1, a plurality of module connection portions 10 are provided, so it is possible to connect a plurality of modules 4 inside the enclosure 3. Additionally, the module connection portions 10 are provided inside the enclosure 3, so the modules 4 can be easily attached to and detached from the enclosure 3. The connection tube 8 is connected to a cooling unit 7 mounted on a module 4, so it is possible to attach and detach a module 4, a cooling unit 7 and a connection tube 8 as a unit with respect to the enclosure 3. As a result thereof, it is possible to easily perform work such as the replacement of a module 4 inside the enclosure 3.

[Second Embodiment]

Figure 2:
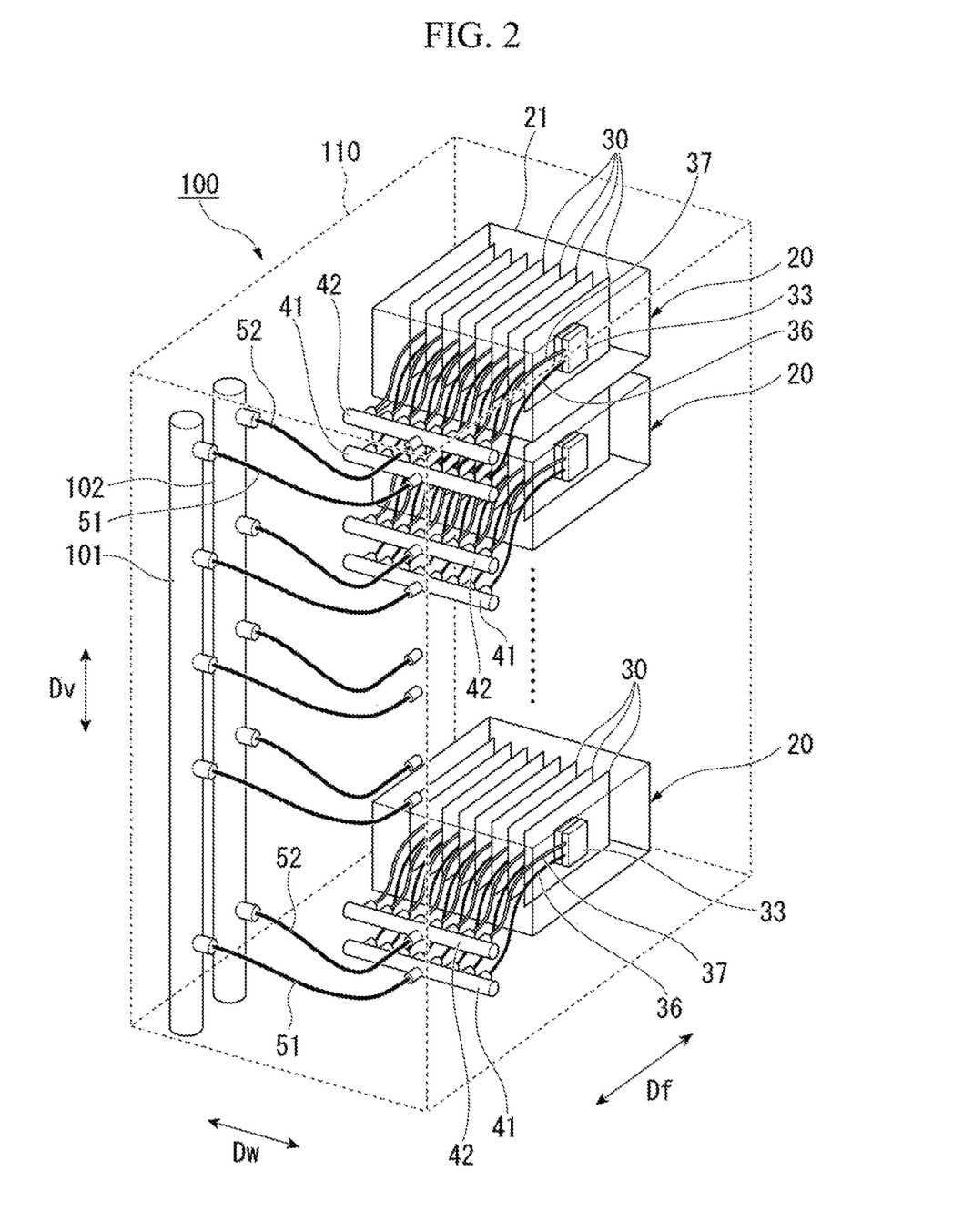
FIG. 2 is a perspective view illustrating the structure of a server device according to a second embodiment.
Figure 3:
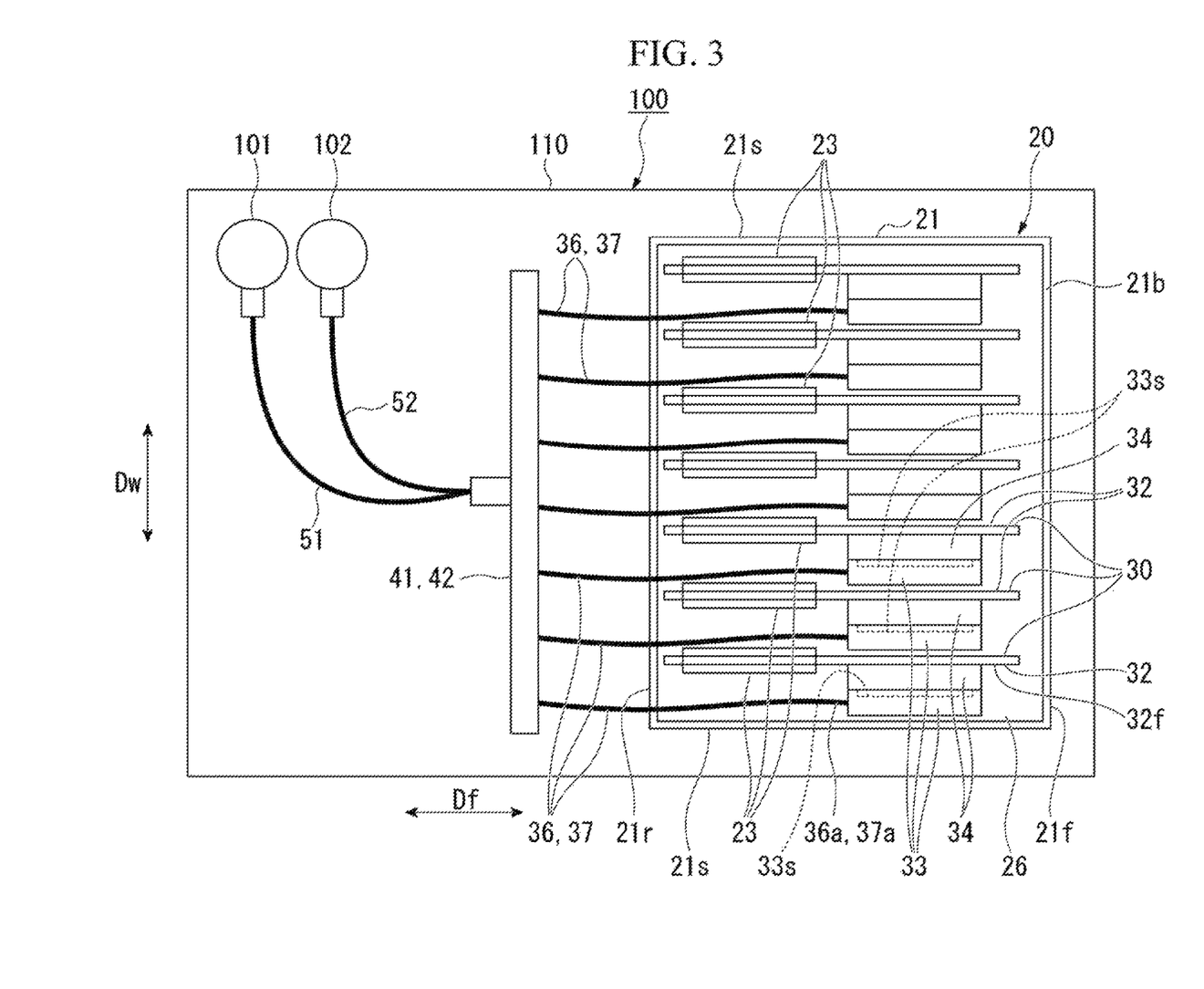
FIG. 3 is a plan view illustrating the structure of the server device according to the second embodiment.

FIG. 2 is a perspective view illustrating the structure of a server device according to a second embodiment. FIG. 3 is a plan view illustrating the structure of the server device according to the second embodiment.

As illustrated in FIG. 2 and FIG. 3, the server device (device) 100 of the present embodiment mainly comprises a rack 110, servers 20 housed inside the rack 110, a supply tube (main pipe) 101 and a discharge tube (main pipe) 102.

The rack 110 houses, in the interior thereof, a plurality of servers 20 arranged in the vertical direction Dv.

The supply tube 101 and the discharge tube 102 are provided inside the rack 110. The supply tube 101 and the discharge tube 102 are provided, inside the rack 110, to the rear of the server 20 in the front-rear direction Df. The supply tube 101 and the discharge tube 102 each extend in the vertical direction Dv. The supply tube 101 supplies, for example, cooling water, as a cooling medium, to the server device 100. The discharge tube 102 discharges cooling water from the server device 100.

Figure 4:
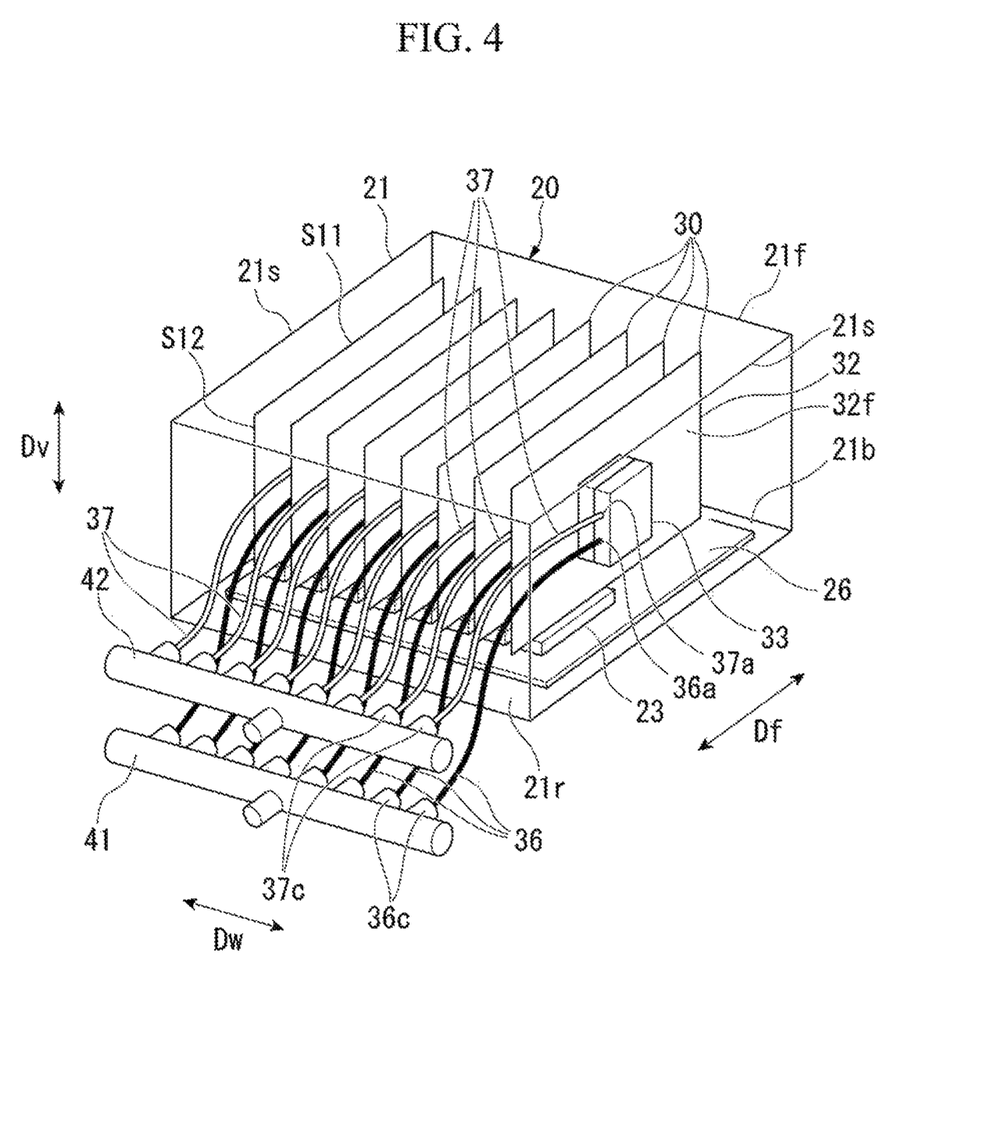
FIG. 4 is a perspective view illustrating the structure of a server according to the second embodiment.
Figure 5:
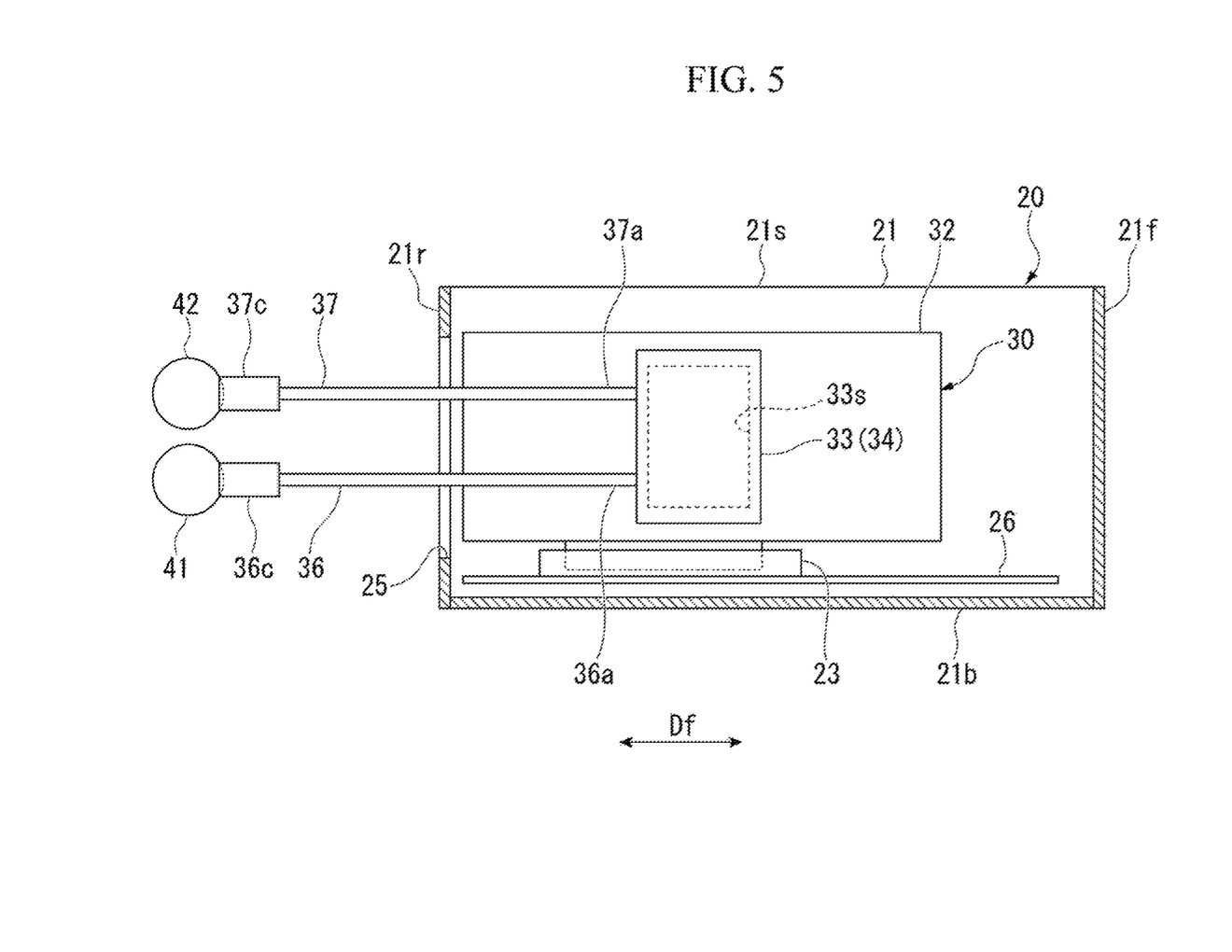
FIG. 5 is a section view illustrating the structure of the server according to the second embodiment.

FIG. 4 is a perspective view illustrating the structure of a server according to the second embodiment. FIG. 5 is a section view illustrating the structure of the server according to the second embodiment.

As illustrated in FIGS. 3 to 5, the server 20 comprises an enclosure 21, module connectors (module connection portions) 23 and modules 30.

The enclosure 21 is in the form of a rectangular parallelepiped-shaped hollow box. The enclosure 21 is supported so as to be able to slide inside the rack 110 in the front-rear direction (sliding direction) Df by means of a slide rail (not illustrated). The enclosure 21 comprises a bottom plate 21b, side plates 21s, a front plate 21f and a rear plate 21r.

In plan view, the bottom plate 21b is rectangular, extending in the front-rear direction Df and in the width direction Dw orthogonal to the front-rear direction Df. The side plates 21s are located on both sides, in the width direction Dw, of the bottom plate 21b. The side plates 21s respectively extend upward, in the vertical direction Dv, from both sides, in the width direction Dw, of the bottom plate 21b. The front plate 21f is positioned on one end, in the front-rear direction Df, of the bottom plate 21b. The front plate 21f extends upward from the front end of the bottom plate 21b. The rear plate 21r is located on the other end, in the front-rear direction Df, of the bottom plate 21b. The rear plate 21r extends upward from the rear end of the bottom plate 21b.

As illustrated in FIG. 5, the rear plate 21r has openings 25 penetrating therethrough in the front-rear direction Df. A plurality of openings 25 are provided so as to be spaced in the width direction Dw.

Inside the enclosure 21, a base substrate 26 is provided. The base substrate 26 is plate-shaped, and is provided along the bottom plate 21b of the enclosure 21.

Module connectors 23 are provided on the upper surface of the base substrate 26. A plurality of module connectors 23 are provided so as to be spaced in the width direction Dw.

As illustrated in FIGS. 3 to 5, a module 30 comprises a substrate 32, a cooling unit 33, a supply connection tube (connection tube) 36 and a discharge connection tube (connection tube) 37.

The substrate 32 is in the form of a rectangular plate. In the state in which the module 30 is housed in the enclosure 21, the substrate 32 is arranged so that a long edge S11 is aligned with the front-rear direction Df and the short edge S12 is aligned with the vertical direction Dv. The substrate 32 is connected, so as to be able to be inserted and removed, to a module connector 23 provided on the base substrate 26.

The substrate 32 has a heat-generating component 34 such as a CPU (Central Processing Unit). The heat-generating component 34 is mounted on one surface 32f of the substrate 32. The heat-generating component 34 is not limited to being a CPU, and may be another electronic component.

The cooling unit 33 is provided on the substrate 32. The cooling unit 33 is provided so as to be stacked on the heat-generating component 34. The cooling unit 33 cools the heat-generating component 34. The cooling unit 33 has a prescribed thickness in the direction orthogonal to the one surface 32f of the substrate 32. The cooling unit 33 has a recess 33s on the surface facing the heat-generating component 34. The recess 33s faces at least part of the surface of the heat-generating component 34.

The supply connection tube 36 has one end 36a connected to the cooling unit 33. The supply connection tube 36 extends outside the substrate 32. The supply connection tube 36 extends from the substrate 32 through an opening 25 formed in the rear plate 21r of the enclosure 21, and to the rear of the enclosure 21. The supply connection tube 36 has flexibility. The supply connection tube 36 has a connection elbow 36c on the other end extending to the rear of the enclosure 21.

The discharge connection tube 37 has one end 37a connected to the cooling unit 33. The discharge connection tube 37 extends to the outside of the substrate 32. The discharge connection tube 37 extends from the substrate 32 through an opening 25 formed in the rear plate 21r of the enclosure 21, and to the rear of the enclosure 21. The discharge connection tube 37 has flexibility. The discharge connection tube 37 has a connection elbow 37c on the other end extending to the rear of the enclosure 21.

Such a module 30 is connected to each of the plurality of module connectors 23 provided in the width direction (first direction) Dw inside the enclosure 21. As a result thereof, a plurality of modules 30 arranged along the width direction Dw are provided inside the enclosure 21.

As illustrated in FIG. 2 and FIG. 4, inside the rack 110, supply branching tubes (branching tubes) 41 and discharge branching tubes (branching tubes) 42 are provided. A supply branching tube 41 and a discharge branching tube 42 are provided outside the enclosure 21 of each server 20. The supply branching tube 41 and the discharge branching tube 42 are provided to the rear, in the front-rear direction Df, of each server 20. In other words, the supply branching tube 41 and the discharge branching tube 42 are provided on one side (to the rear) in the sliding direction (front-rear direction Df) of the enclosure 21. The supply branching tube 41 and the discharge branching tube 42 are each supported on the enclosure 21 by a supporting member, which is not illustrated.

The supply branching tube 41 and the discharge branching tube 42 each extend in the width direction Dw of the enclosure 21. On the supply branching tube 41, a plurality of connection portions, to which connection elbows 36c of supply connection tubes 36 are connected, are provided along the axial direction (width direction Dw) of the supply branching tube 41. The connection elbows 36c of the supply connection tubes 36 are detachably connected to the supply branching tube 41. As a result thereof, the supply branching tube 41 and the cooling units 33 of the modules 30 are respectively connected by supply connection tubes 36.

On the discharge branching tube 42, a plurality of connection portions, to which connection elbows 37c of discharge connection tubes 37 are connected, are provided along the axial direction (width direction Dw) of the discharge branching tube 42. The connection elbows 37c of the discharge connection tubes 37 are detachably connected to the discharge branching tube 42. As a result thereof, the discharge branching tube 42 and the cooling units 33 of the modules 30 are respectively connected by discharge connection tubes 37.

The supply branching tube 41 and the discharge branching tube 42 are provided so as to leave a gap therebetween. Specifically, the supply branching tube 41 and the discharge branching tube 42 are provided so as to leave a gap in the vertical direction Dv. In other words, the supply branching tube 41 and the discharge branching tube 42 are located at different positions in the vertical direction Dv. The supply branching tube 41 and the discharge branching tube 42 are provided at positions facing the rear plate 21r of the enclosure 21 in the front-rear direction Df.

Thus, a plurality of supply branching tubes 41 and discharge branching tubes 42 are provided so as to be respectively connected to the plurality of enclosures 21. The supply branching tubes 41 and the discharge branching tubes 42, as mentioned above, are supported on the enclosures 21 by means of support members (not illustrated), and thus can slide, together with the enclosures 21, in the front-rear direction Df inside the rack 110.

Therefore, when the enclosure 21 of each server 20 is made to slide in the front-rear direction Df inside the rack 110, the modules 30, the supply branching tube 41 and the discharge branching tube 42 slide together with the enclosure 21. In this case, modules 30 connected to the module connectors 23 are housed inside the enclosure 21, and the cooling units 33 are in a state of connection to the supply branching tube 41 and the discharge branching tube 42, by means of supply connection tubes 36 and discharge connection tubes 37, respectively.

As illustrated in FIG. 2, the supply branching tubes 41 are connected to the supply tube 101. The supply branching tubes 41 are detachably connected to the supply tube 101. The supply tube 101 and the supply branching tubes 41 are connected by means of intermediate connection tubes (second connection tubes) 51 having flexibility. The intermediate connection tubes 51 are detachably connected to the supply tube 101.

The supply branching tubes 42 are connected to the supply tube 102. The supply branching tubes 42 are detachably connected to the discharge tube 102. The discharge tube 102 and the discharge branching tubes 42 are connected by means of intermediate connection tubes (second connection tubes) 52 having flexibility. The intermediate connection tubes 52 are detachably connected to the discharge tube 102.

Thus, the plurality of sets of supply branching tubes 41 and discharge branching tubes 42 provided respectively on the servers 20 are respectively detachably connected to a single supply tube 101 and a single discharge tube 102.

Cooling water is fed, through the supply tube 101, to the supply discharge tube 41 of each server 20. In each server 20, cooling water is fed through the supply branching tubes 41 to the supply connection tubes 36. The supply connection tubes 36 supply cooling water to the recesses 33s in the cooling units 33.

The discharge connection tubes 37 discharge cooling water from the recesses 33s in the cooling units 33. The cooling water that is discharged through the discharge connection tubes 37 is discharged from the discharge branching tubes 42 and the discharge tube 102 to the outside.

This server device 100 comprises a rack 110, enclosures 21 provided inside the rack 110, and modules 30 provided inside the enclosures 21. This server device 100 comprises a supply tube 101, a discharge tube 102, supply branching tubes 41, discharge branching tubes 42, supply connection tubes 36 and discharge connection tubes 37. Furthermore, modules 30 are connected to a plurality of module connectors 23 provided inside the enclosures 21, and the enclosures 21 are able to slide in a state in which the cooling units 33 are connected to the supply branching tubes 41 and the discharge branching tubes 42 respectively by means of the supply connection tubes 36 and the discharge connection tubes 37.

As a result thereof, the enclosures 21 can be pulled out from the rack 110 and maintenance work and the like can be performed on the servers 20 without removing the supply branching tubes 41 and the discharge branching tubes 42 respectively from the supply connection tubes 36 and the discharge connection tubes 37. Additionally, a plurality of module connectors 23 are provided, so a plurality of modules 30 can be connected inside an enclosure 21. Additionally, when an enclosure 21 is in a state of removal from the rack 110, the module connectors 23 are provided inside the enclosure 21, so the modules 30 can be easily attached to and detached from the enclosure 21. Therefore, work such as the replacement of modules 30 inside the enclosure 21 can be easily performed.

In this server device 100, the supply branching tubes 41 and the discharge branching tubes 42 are respectively detachably connected to the supply tube 101 and the discharge tube 102. The supply branching tubes 41 and the discharge branching tubes 42 are respectively removed from the supply tube 101 and the discharge tube 102. As a result thereof, when a supply branching tube 41, a discharge branching tube 42 and an enclosure 21 are made to slide, the supply branching tube 41 and the discharge branching tube 42 can be moved together with the enclosure 21. As a result thereof, the modules 30 can be easily attached to and detached from the enclosure 21 that has been made to slide.

In this server device 100, in a configuration in which the modules 30 are able to be attached to and detached from the module connectors 23, the supply connection tubes 36 and the discharge connection tubes 37 are able to be respectively attached to and detached from the supply branching tubes 41 and the discharge branching tubes 42. As a result thereof, the modules 30, the supply connection tubes 36 and the discharge connection tubes 37 can be removed from the enclosures 21 together. Therefore, the modules 30 (and the supply connection tubes 36 and the discharge connection tubes 37) can be easily replaced.

In this server device 100, supply connection tubes 36 and discharge connection tubes 37 having one end 36a, 37a connected to the modules 30 are arranged in the width direction Dw, which is the direction in which the modules 30 are arrayed. As a result thereof, the connection elbows 36c, 37c on the other ends of the supply connection tubes 36 and the discharge connection tubes 37 can be easily connected, respectively, to the supply branching tubes 41 and the discharge branching tubes 42, which extend in the width direction Dw.

In this server device 100, the supply branching tubes 41 and the discharge branching tubes 42 are provided outside the enclosures 21. As a result thereof, the work for attaching and detaching the supply connection tubes 36 and the discharge connection tubes 37 of the modules 30 with respect to the supply branching tubes 41 and the discharge branching tubes 42 can be performed outside the enclosures 21, thereby raising the work efficiency.

In this server device 100, the supply branching tubes 41 and the discharge branching tubes 42 are provided to the rear in the sliding direction of the enclosures 21. As a result thereof, the work for attaching and detaching the supply connection tubes 36 and the discharge connection tubes 37 with respect to the supply branching tubes 41 and the discharge branching tubes 42 can be performed from the rear of the rack 110, thereby raising the work efficiency.

In this server device 100, a supply branching tube 41 and a discharge branching tube 42 are provided on each of a plurality of enclosures 21. Additionally, the plurality of supply branching tubes 41 and the discharge branching tubes 42 are detachably connected, respectively, to a single supply tube 101 and a single discharge tube 102. As a result thereof, a supply branching tube 41 and a discharge branching tube 42 are provided for each enclosure 21. Therefore, it is possible to arrange the supply connection tubes 36 and the discharge connection tubes 37 in an orderly manner between a plurality of servers 20.

In this server device 100, the supply tube 101 and the discharge tube 102 are respectively connected to the supply branching tubes 41 and the discharge branching tubes 42 by means of intermediate connection tubes 51, 52 having flexibility.

As a result thereof, the enclosures 21 can be made to slide forward and rearward to some degree with the supply tube 101 and the discharge tube 102 respectively still connected to the supply branching tubes 41 and the discharge branching tubes 42 by means of the intermediate connection tubes 51, 52. Additionally, the work of attaching and detaching the intermediate connection tubes 51, 52 to the supply tube 101 and the discharge tube 102, and to the supply branching tubes 41 and the discharge branching tubes 42, respectively, can be easily performed.

In such a server device 100, the supply connection tubes 36 and the discharge connection tubes 37 can be respectively connected to the supply branching tubes 41 and the discharge branching tubes 42 provided outside the enclosures 21 through openings 25 formed in the enclosures 21.

[First Modified Example of Second Embodiment]

In the above-mentioned second embodiment, the supply connection tubes 36 and the discharge connection tubes 37 were arranged to be connected, respectively, to the supply branching tubes 41 and the discharge branching tubes 42 from the front in the front-rear direction Df. For example, the supply connection tubes 36 and the discharge connection tubes 37 were respectively connected to sites located on the front sides, in the front-rear direction Df, of the supply branching tubes 41 and the discharge branching tubes 42. However, there is no limitation thereto.

Figure 6:
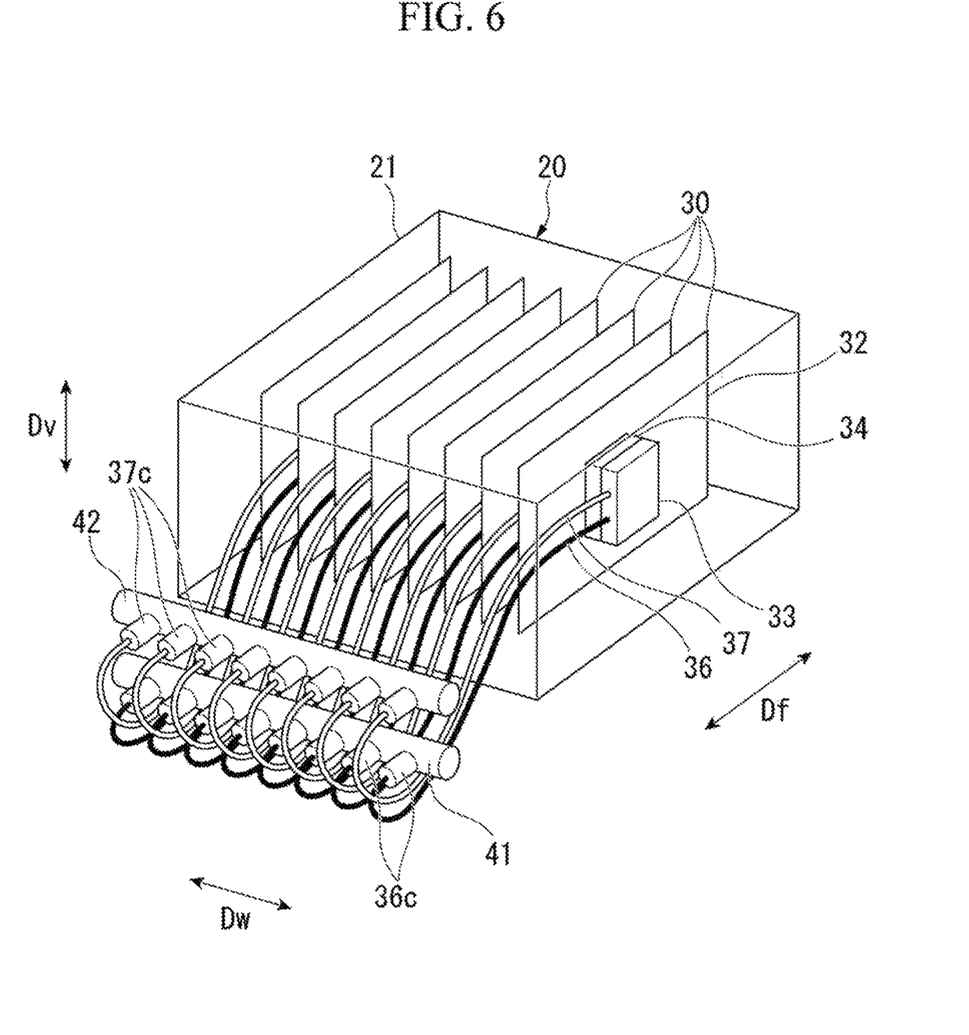
FIG. 6 is a perspective view illustrating the structure of a server according to a first modified example of the second embodiment.

FIG. 6 is a perspective view illustrating the structure of a server according to a first modified example of the second embodiment.

As illustrated in FIG. 6, the supply connection tubes 36 and the discharge connection tubes 37 are respectively connected to the supply branching tube 41 and the discharge branching tube 42 at sites other than sites facing the enclosure 21. For example, the supply connection tubes 36 and the discharge connection tubes 37 are respectively connected to the supply branching tube 41 and the discharge branching tube 42 at sites at locations different from sites facing the enclosure 21. In the present modified example, the connection elbows 36c, 37c of the supply connection tubes 36 and the discharge connection tubes 37 are respectively connected to the supply branching tube 41 and the discharge branching tube 42 from the rear in the front-rear direction Df. For example, the supply connection tubes 36 and the discharge connection tubes 37 are respectively connected at sites positioned on the rear sides, in the front-rear direction Df, of the supply branching tube 41 and the discharge branching tube 42.

In this server device 100, the work of attaching and detaching the supply connection tubes 36 and the discharge connection tubes 37, respectively, to the supply branching tube 41 and the discharge branching tube 42 can be performed from the rear of the supply branching tube 41 and the discharge branching tube 42. As a result thereof, the work efficiency is raised.

[Second Modified Example of Second Embodiment]

Figure 7:
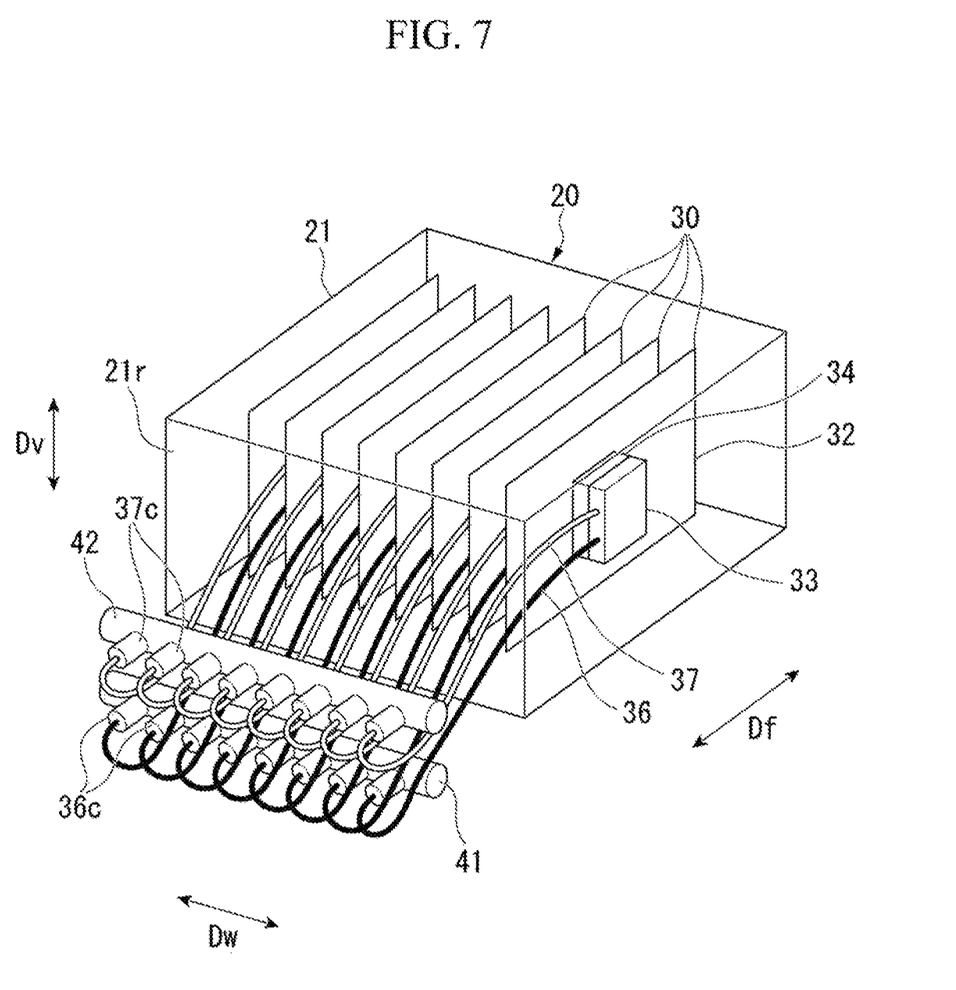
FIG. 7 is a perspective view illustrating the structure of a server according to a second modified example of the second embodiment.

FIG. 7 is a perspective view illustrating the structure of a server according to the second modified example of the second embodiment.

As illustrated in FIG. 7, a supply branching tube 41 and a discharge branching tube 42 are provided so as to leave a gap therebetween in the vertical direction Dv. The supply branching tube 41 and the discharge branching tube 42 are provided at positions facing the rear plate 21r of the enclosure 21 in the front-rear direction Df.

The supply connection tubes 36 and the discharge connection tubes 37 extend to the rear of the supply branching tube 41 and the discharge branching tube 42 by passing in between the supply branching tube 41 and the discharge branching tube 42. The supply connection tubes 36 and the discharge connection tubes 37 respectively curve forward at the rear, in the front-rear direction Df, of the supply branching tube 41 and the discharge branching tube 42. The supply connection tubes 36 and the discharge connection tubes 37 are respectively connected to the supply branching tube 41 and the discharge branching tube 42 at sites other than sites facing the enclosure 21. In the present modified example, the connection elbows 36c, 37c of the supply connection tubes 36 and the discharge connection tubes 37 are respectively connected from the rear, in the front-rear direction Df, of the supply branching tube 41 and the discharge branching tube 42.

In this server device 100, the supply branching tube 41 and the discharge branching tube 42 are provided with a gap therebetween. As a result thereof, the supply connection tubes 36 an the discharge connection tubes 37 can be passed between the supply branching tube 41 and the discharge branching tube 42. Additionally, working space for attaching and detaching the supply connection tubes 36 and the discharge connection tubes 37, respectively, to the supply branching tube 41 and the discharge branching tube 42 can be secured.

In this server device 100, the supply branching tube 41 and the discharge branching tube 42 are provided so as to leave a gap therebetween in the vertical direction. The supply connection tubes 36 and the discharge connection tubes 37 are arranged to pass between the supply branching tube 41 and the discharge branching tube 42. Thus, the supply connection tubes 36 and the discharge connection tubes 37 can be kept from sagging down by passing the supply connection tubes 36 and the discharge connection tubes 37 between the supply branching tube 41 and the discharge branching tube 42.

In this server device 100, the supply branching tube 41 and the discharge branching tube 42 are respectively connected with the supply connection tubes 36 and the discharge connection tubes 37 on sides not facing the enclosure 21, in other words, on the rear sides in the front-rear direction Df. As a result thereof, the connection work for connecting the supply connection tubes 36 and the discharge connection tubes 37, respectively, with the supply branching tube 41 and the discharge branching tube 42 can be easily performed from the rear of the supply branching tube 41 and the discharge branching tube 42.

In the above-mentioned second embodiment and the modified examples thereof, the intermediate connection tubes 51, 52 are respectively detachably connected to the supply tube 101 and the discharge tube 102, but the intermediate connection tubes 51, 52 may be provided with slack. As a result thereof, it is possible to slide the enclosures 21 in the front-rear direction Df while the supply branching tubes 41 and the discharge branching tubes 42 remain connected to the supply tube 101 and the discharge tube 102 by means of the intermediate connection tubes 51, 52.

Additionally, the supply branching tubes 41 and the discharge branching tubes 42 were connected, respectively, to the supply tube 101 and the discharge tube 102 by means of flexible intermediate connection tubes 51, 52. However, the invention is not limited to such a structure.

Figure 8:
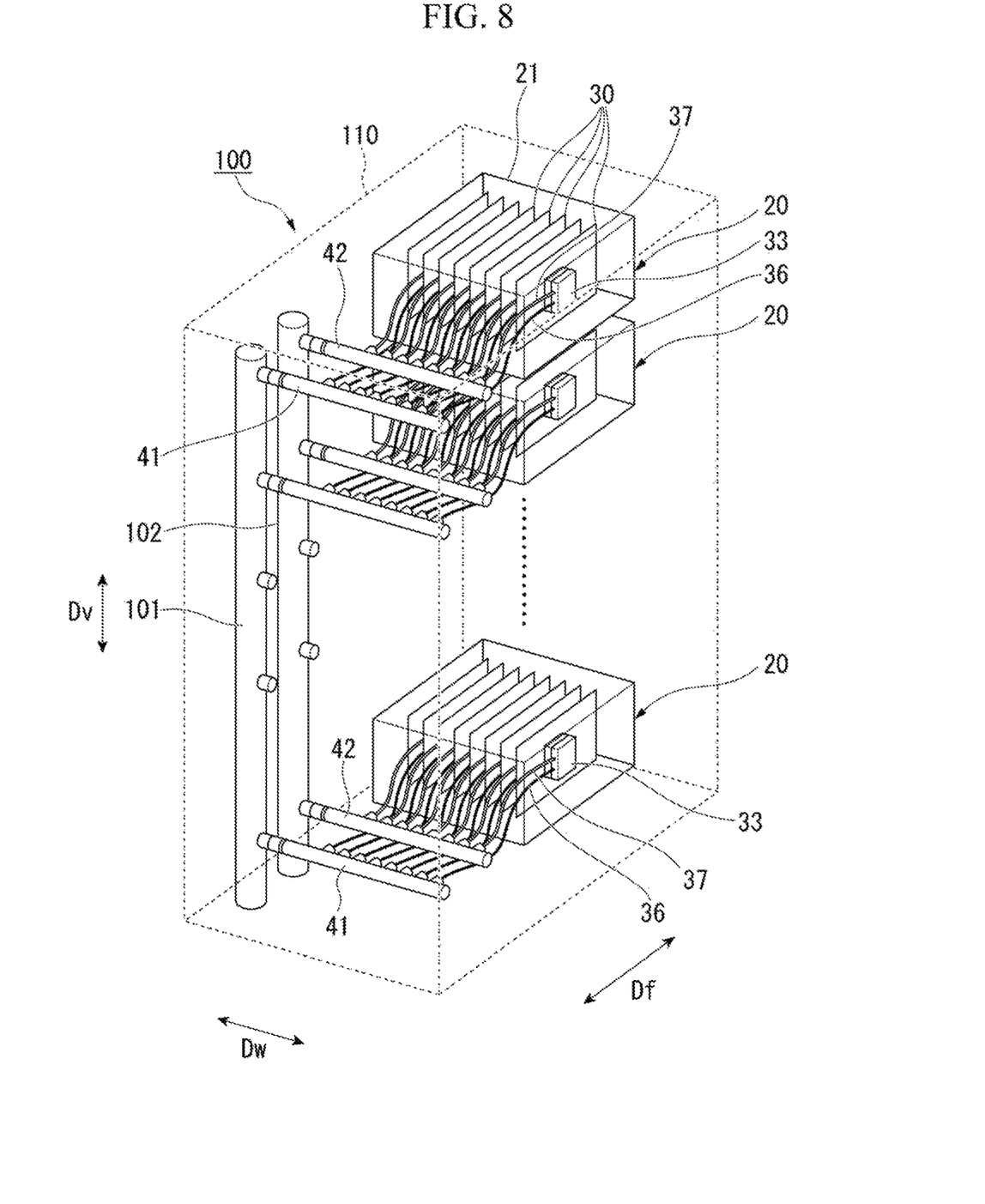
FIG. 8 is a perspective view illustrating the structure of a server device according to another modified example of the second embodiment.

FIG. 8 is a perspective view illustrating the structure of a server device according to another modified example of the second embodiment.

As illustrated in FIG. 8, the ends of the supply branching tubes 41 and the discharge branching tubes 42 may be directly connected, respectively, to the supply tube 101 and the discharge tube 102, without the intermediate connection tubes 51, 52 therebetween.

Furthermore, the positions of the supply tube 101 and the discharge tube 102 are not limited to those indicated in the above-mentioned embodiments. The supply tube 101 and the discharge tube 102 may, for example, be provided at a central area in the width direction Dw or the like. Additionally, the supply tube 101 and the discharge tube 102 may be extended in the width direction Dw rather than in the vertical direction Dv, or may be provided in an upper area or a lower area of the rack 110.

Aside therefrom, it is possible to select whether or not to adopt features described in the above-mentioned embodiments, or to appropriately replace some of the features with other features, as long as the resulting device does not depart from the spirit of the present invention.

Some or all of the above-mentioned embodiments may be described as in the following supplementary notes, but the present invention is not limited to the following.

(Supplementary Note 1)

A device comprising:
a rack;
an enclosure provided inside the rack;
a module provided inside the enclosure;
a main pipe provided in the rack;
a branching tube connected to the main pipe;
a cooling unit that cools a heat-generating component mounted on the module;
a first connection tube that connects the branching tube with the cooling unit; and
a plurality of module connection portions that are provided inside the enclosure and to which the module is connected;
wherein the enclosure can slide in a state in which the module is connected to the module connection portion, and the cooling unit and the branching tube are connected by the first connection tube.

(Supplementary Note 2)

The device according to supplementary note 1, wherein the branching tube is detachably connected to the main pipe.

(Supplementary Note 3)

The device according to supplementary note 1 or 2, wherein:
on the first connection tube, one end of which is connected to the cooling unit, the other end is detachably connected to the branching tube.

(Supplementary Note 4)

The device according to any one of supplementary notes 1 to 3, wherein:
a plurality of the modules, which are connected to the module connection portions inside the enclosure, are arrayed in a first direction; and
the branching tube is arranged so as to extend in the first direction.

(Supplementary Note 5)

The device according to any one of supplementary notes 1 to 4, wherein:
the branching tube is provided outside the enclosure.

(Supplementary Note 6)

The device according to supplementary note 5, wherein the branching tube is provided on one side in a sliding direction of the enclosure.

(Supplementary Note 7)

The device according to any one of supplementary notes 1 to 6, wherein:
a plurality of enclosures are housed inside the rack;
a plurality of the branching tubes are connected, respectively, to the plurality of enclosures; and
the plurality of branching tubes are detachably connected to the single main pipe.

(Supplementary Note 8)

The device according to any one of supplementary notes 1 to 7, wherein:
the main pipe and the branching tube are connected by a second connection tube having flexibility.

(Supplementary Note 9)

The device according to any one of supplementary notes 1 to 8, wherein:
an opening is formed in the enclosure; and
the first connection tube is arranged to pass through the opening.

(Supplementary Note 10)

The device according to any one of supplementary notes 1 to 9, wherein:
the branching tube has a supply branching tube that supplies a cooling medium to the module and a discharge branching tube that discharges the cooling medium; and
the supply branching tube and the discharge branching tube are provided so as to leave a gap therebetween.

(Supplementary Note 11)

The device according to supplementary note 10, wherein:
the supply branching tube and the discharge branching tube are provided so as to leave a gap in a vertical direction; and
the first connection tube is arranged to pass between the supply branching tube and the discharge branching tube.

(Supplementary Note 12)

The device according to any one of supplementary notes 1 to 11, wherein:
the branching tube is provided at a position facing the enclosure; and
the first connection tube is connected to the branching tube at a site other than a site facing the enclosure.

INDUSTRIAL APPLICABILITY

According to the device of the present invention, it is possible to easily perform work such as the replacement of a module inside an enclosure.

[Reference Signs List]
1 Device
2 Rack
3 Enclosure
4 Module
5 Main pipe
6 Branching tube
7 Cooling unit
8 Connection tube
9 Heat-generating component
10 Module connection portion
20 Server
21 Enclosure
23 Module connector (module connection portion)
25 Opening
30 Module
33 Cooling unit
34 Heat-generating component
36 Supply connection tube (first connection tube)
36a One end
36c Connection elbow
37 Discharge connection tube (first connection tube)
37a One end
37c Connection elbow
41 Supply branching tube (branching tube)
42 Discharge branching tube (branching tube)
51 Intermediate connection tube (second connection tube)
52 Intermediate connection tube (second connection tube)
100 Server device (device)
101 Supply tube (main pipe)
102 Discharge tube (main pipe)
110 Rack
Df Front-rear direction (sliding direction)
Dv Vertical direction
Dw Width direction (first direction)

The invention claimed is:

1. A device comprising:
a rack;
an enclosure provided inside the rack;
a module provided inside the enclosure;
a main pipe provided in the rack;
a branching tube connected to the main pipe;
a cooling unit that cools a heat-generating component mounted on the module;
a first connection tube that connects the branching tube with the cooling unit; and
a plurality of module connection portions that are provided inside the enclosure and to which the module is connected;
wherein the enclosure can slide in a state in which the module is connected to the module connection portion, and the cooling unit and the branching tube are connected by the first connection tube,
a plurality of enclosures are housed inside the rack,
a plurality of the branching tubes are connected, respectively, to the plurality of enclosures, and
the plurality of branching tubes are detachably connected to the single main pipe.

2. The device according to claim 1, wherein the branching tube is detachably connected to the main pipe.

3. The device according to claim 1, wherein:
on the first connection tube, one end of which is connected to the cooling unit, the other end is detachably connected to the branching tube.

4. The device according to claim 1, wherein:
a plurality of the modules, which are connected to the module connection portions inside the enclosure, are arrayed in a first direction; and
the branching tube is arranged so as to extend in the first direction.

5. The device according to claim 1, wherein:
the branching tube is provided outside the enclosure.

6. The device according to claim 5, wherein the branching tube is provided on one side in a sliding direction of the enclosure.

7. The device according to claim 1, wherein:
the main pipe and the branching tube are connected by a second connection tube having flexibility.

8. The device according to claim 1, wherein:
the branching tube is provided at a position facing the enclosure; and
the first connection tube is connected to the branching tube at a site other than a site facing the enclosure.

9. A device comprising:
a rack;
an enclosure provided inside the rack;
a module provided inside the enclosure;
a main pipe provided in the rack;
a branching tube connected to the main pipe;
a cooling unit that cools a heat-generating component mounted on the module;
a first connection tube that connects the branching tube with the cooling unit and
a plurality of module connection portions that are provided inside the enclosure and to which the module is connected;
wherein the enclosure can slide in a state in which the module is connected to the module connection portion, and the cooling unit and the branching tube are connected by the first connection tube,
an opening is formed in the enclosure, and
the first connection tube is arranged to pass through the opening.

10. A device comprising:
a rack;
an enclosure provided inside the rack;
a module provided inside the enclosure;
a main pipe provided in the rack;
a branching tube connected to the main pipe;
a cooling unit that cools a heat-generating component mounted on the module;
a first connection tube that connects the branching tube with the cooling unit and
a plurality of module connection portions that are provided inside the enclosure and to which the module is connected;
wherein the enclosure can slide in a state in which the module is connected to the module connection portion, and the cooling unit and the branching tube are connected by the first connection tube,
the branching tube has a supply branching tube that supplies a cooling medium to the module and a discharge branching tube that discharges the cooling medium, and
the supply branching tube and the discharge branching tube are provided so as to leave a gap therebetween.

11. The device according to claim 10, wherein:
the supply branching tube and the discharge branching tube are provided so as to leave a gap in a vertical direction; and the first connection tube is arranged to pass between the supply branching tube and the discharge branching tube.

* * * * *